United States Patent
Wang et al.

(10) Patent No.: US 10,497,820 B1
(45) Date of Patent: Dec. 3, 2019

(54) WEDGE-SHAPED FIBER ARRAY ON A SILICON-PHOTONIC DEVICE AND METHOD FOR PRODUCING THE SAME

(71) Applicant: GLOBALFOUNDRIES Singapore Pte. Ltd., Singapore (SG)

(72) Inventors: Dandan Wang, Singapore (SG); Lei Zhu, Singapore (SG); Zhihong Mai, Singapore (SG); Jeffrey Chor-Keung Lam, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/995,949

(22) Filed: Jun. 1, 2018

(51) Int. Cl.
*G02B 6/30* (2006.01)
*H01L 31/0232* (2014.01)
*G02B 6/38* (2006.01)

(52) U.S. Cl.
CPC .......... *H01L 31/02327* (2013.01); *G02B 6/30* (2013.01); *G02B 6/3839* (2013.01); *G02B 6/3885* (2013.01)

(58) Field of Classification Search
CPC ... H01L 31/02327; G02B 6/30; G02B 6/3885; G02B 6/3839
See application file for complete search history.

(56) References Cited

U.S. PATENT DOCUMENTS

| | | | |
|---|---|---|---|
| 5,656,120 A | 8/1997 | Ota et al. | |
| 5,743,785 A * | 4/1998 | Lundberg | B24B 19/226 451/270 |
| 5,842,373 A | 12/1998 | Stein et al. | |
| 5,980,120 A | 11/1999 | Narayanan | |
| 6,257,770 B1 * | 7/2001 | Sato | G02B 6/3865 385/71 |
| 6,821,027 B2 * | 11/2004 | Lee | G02B 6/4249 385/89 |
| 6,866,426 B1 | 3/2005 | Steinberg et al. | |
| 8,936,403 B2 * | 1/2015 | Howard | G02B 6/3829 385/89 |

(Continued)

FOREIGN PATENT DOCUMENTS

EP  1326109 A2  7/2003

OTHER PUBLICATIONS

Coster et al., "Test-station for Flexible Semi-automatic Wafer-level Silicon Photonics Testing", 21st European Test Symposium, 2016, retrieved on Feb. 5, 2018 from https://www.formfactor.com/download/test-station-for-flexible-semi-automatic-wafer-level-silicon-photonics-testing/?wpdmdl=3453&ind=0, 5 Pages.

(Continued)

*Primary Examiner* — Ellen E Kim
(74) *Attorney, Agent, or Firm* — Ditthavong & Steiner, P.C.

(57) ABSTRACT

A method of forming a wedge-shaped fiber array and a bottom base according to a probing pad layout of a Si-Photonic device to enable optical, DC and RF mixed signal tests to be performed at the same time and the resulting device are provided. Embodiments include a bottom base; and a fiber array with sidewalls and a top surface having a first angle and a second angle, respectively, over the bottom base, wherein the fiber array is structured to expose bond pads of a Si-Photonic device during wafer level Si-Photonic testing.

16 Claims, 8 Drawing Sheets

(56) References Cited

U.S. PATENT DOCUMENTS

| | | | | |
|---|---|---|---|---|
| 9,020,322 | B2* | 4/2015 | Chan | G02B 6/4214 |
| | | | | 385/139 |
| 9,234,854 | B2 | 1/2016 | Assefa et al. | |
| 9,645,329 | B2* | 5/2017 | de Jong | G02B 6/32 |
| 10,120,147 | B2* | 11/2018 | Furuya | G02B 6/4231 |
| 2008/0116910 | A1* | 5/2008 | Hung | G01R 31/2884 |
| | | | | 324/750.3 |
| 2010/0135618 | A1* | 6/2010 | Howard | G02B 6/3829 |
| | | | | 385/79 |
| 2015/0309267 | A1* | 10/2015 | Isenhour | G02B 6/3821 |
| | | | | 385/90 |
| 2016/0147026 | A1* | 5/2016 | Kurtz | G02B 6/3839 |
| | | | | 385/89 |
| 2016/0209610 | A1* | 7/2016 | Kurtz | G02B 6/4292 |
| 2016/0274318 | A1* | 9/2016 | Vallance | G02B 6/428 |
| 2017/0234767 | A1 | 8/2017 | Leclerc et al. | |
| 2017/0351044 | A1* | 12/2017 | Xu | G02B 6/4246 |
| 2018/0013494 | A1* | 1/2018 | Young | G02B 6/30 |
| 2018/0143421 | A1* | 5/2018 | Hegenbarth | A61B 1/00096 |

OTHER PUBLICATIONS

Jordan "Conquering the Silicon Photonics Production Bottleneck", Photonics Spectra, Aug. 2017, retrieved on Feb. 5, 2018 from http://www.photonicsspectra-digital.com/photonicsspectra/august_2017?folio=46&pg=46#pg46, 8 Pages.

Physik Instrumente LP, "Fast Optical Alignment for SIP Production", Jan. 12, 2016, retrieved on Feb. 5, 2018 from http://www.pi-usa.us/blog/fast-optical-alignment-for-sip-production/, 4 Pages.

Physik Instrumente LP, "Multi-Channel Optical Alignment for Testing and Packaging in Silicon Photonics Devices", Apr. 10, 2015, retrieved on Feb. 5, 2018 from https://www.azonano.com/article.aspx?ArticleID=4001, 7 Pages.

Physik Instrumente LP, "Fiber Alignment Systems, Motorized Fiber Positioners, Photonics & Optic Alignment Systems" webpage, retrieved on Jun. 1, 2018 from http://www.pi-usa.us/products/Photonics_Alignment_Solutions/, pp. 1-7.

\* cited by examiner

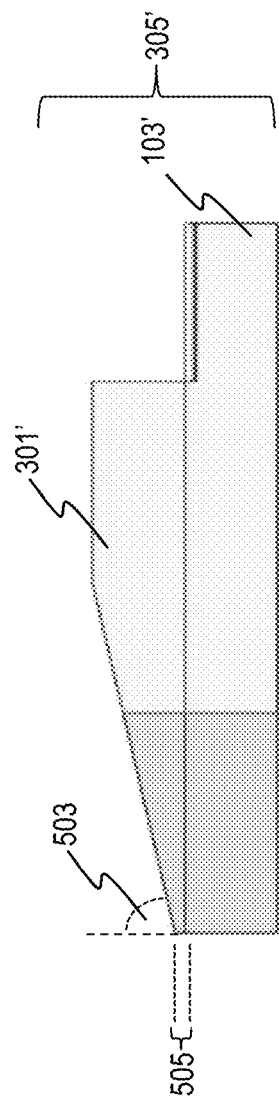
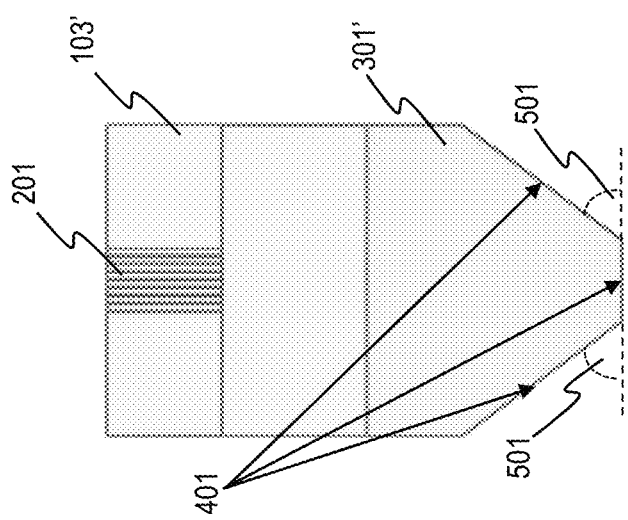
FIG. 5B
FIG. 5A

WEDGE-SHAPED FIBER ARRAY ON A SILICON-PHOTONIC DEVICE AND METHOD FOR PRODUCING THE SAME

TECHNICAL FIELD

The present disclosure generally relates to semiconductor devices, and more specifically to silicon (Si)-photonic devices.

BACKGROUND

In a wafer level Si-Photonics test, a fiber array needs to touch the wafer surface to get the distance zero position. At the fiber array distance zero position, the fiber array may move up to 10 micrometer (μm) by the nano-positioner. A capacitance sensor records the distance 10 μm position and the sensor ensures that the wafer level test is being performed at the recorded distance position of 10 μm. However, during the fiber array touch down to the wafer surface, there is a potential risk of damage on the wafer or the fiber array due to the contact force. This requires a minimum contact area.

A known Si-Photonics device test includes a single fiber, which can be used to do optical test on Si-Photonics device and together with radio frequency (RF) and direct current (DC) measurement. However, single fiber tests have very low throughput and during the test there is a high risk of damage on the wafer and fiber array when the single fiber touches the pad, due to the small contact area. For example, a fiber array typically has a big contact area, e.g., 2 millimeter (mm) by 5 mm or 10 mm squared (mm2) (VT (thickness)×VW (width)). Consequently, it blocks the touch-down of the DC and RF probe tips.

Further, on a Si-Photonic device, there are grating couplers, DC probing pads and RF probing pads. The spacing between the grating couplers and the electrical probing pads is much smaller than that of the bottom area of a known fiber array, e.g., 500 μm. Due to the dimensions and construction of existing fiber arrays and the layout of the pads on the wafer, it is impossible to use the existing fiber array to perform optical, electrical and RF tests at the same time.

A need therefore exists for methodology enabling formation of a fiber array with a smaller contact area to allow optical, DC and RF mixed signal tests to be performed at the same time and the resulting device, that allows for a high throughput and that minimizes potential contact pad damage.

SUMMARY

An aspect of the present disclosure is a device including a wedge-shaped fiber array and a bottom base according to a probing pad layout of a Si-Photonic device.

Another aspect of the present disclosure is a method of forming a wedge-shaped fiber array and a bottom base according to a probing pad layout of a Si-Photonic device to enable optical, DC and RF mixed signal tests to be performed at the same time.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a bottom base; and a fiber array with sidewalls and a top surface having a first angle and a second angle, respectively, over the bottom base, wherein the fiber array is structured to expose bond pads of a Si-Photonic device during wafer level Si-Photonic testing.

Another aspect of the present disclosure is a method including: providing a fiber array; polishing sidewalls and a top surface of the fiber array to a first angle and a second angle, respectively, wherein the fiber array is structured to expose bond pads of a Si-Photonic device; forming a bottom base; and attaching the polished fiber array to the bottom base.

A further aspect of the present disclosure is a method including: providing a fiber array of Si or glass including a pedestal having a plurality of V-shaped grooves, an optical fiber in each V-shaped groove, and a cover over the pedestal; polishing sidewalls and a top surface of the fiber array to a first angle and a second angle, respectively, wherein the first angle and the second angle are based on a distance between a grating coupler and probing pads of a Si-Photonic device; forming a bottom base of Si or glass according to a probing pad layout of the Si-Photonic device and to a thickness according to a layout of the grating coupler and the probing pads; attaching the polished fiber array to the bottom base; and polishing the bottom base subsequent to the attaching for a termination of the fiber array.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 5A and 5B schematically illustrate a top-view and a cross-sectional view of FIG. 4, respectively, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of low test efficiency with single fiber, high risk of damage on the wafer and the fiber array with a single fiber due to the small contact area, known fiber arrays having a big contact area that blocks the touch-down of the DC and RF probe tips attendant upon wafer-level optical, DC and RF mixed signal tests using Si-Photonic devices. The problem is solved, inter alia, by forming a wedge-shaped fiber array and customized bottom base according to the probing pad layout of a Si-Photonic device.

Methodology in accordance with embodiments of the present disclosure includes a bottom base. A fiber array with sidewalls and a top surface having a first angle and a second angle, respectively, over the bottom base. The sidewalls and the top surface of the fiber array expose bond pads of a Si-Photonic device during wafer level Si-Photonic testing.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
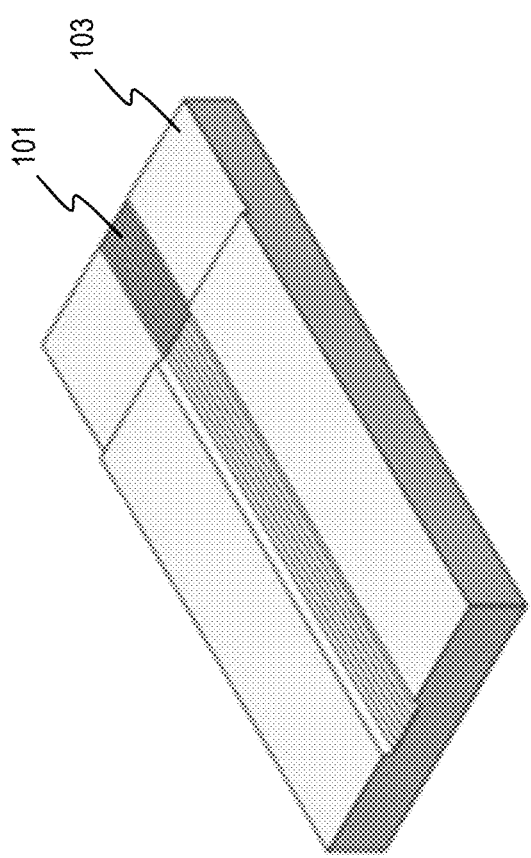
FIGS. 1 through 4, 6 and 7 schematically illustrate cross-sectional views of a process flow for forming a wedge-shaped fiber array and a bottom base according to a probing pad layout of a Si-Photonic device to enable optical, DC and RF mixed signal tests to be performed at the same time, in accordance with an exemplary embodiment.
Figure 2:
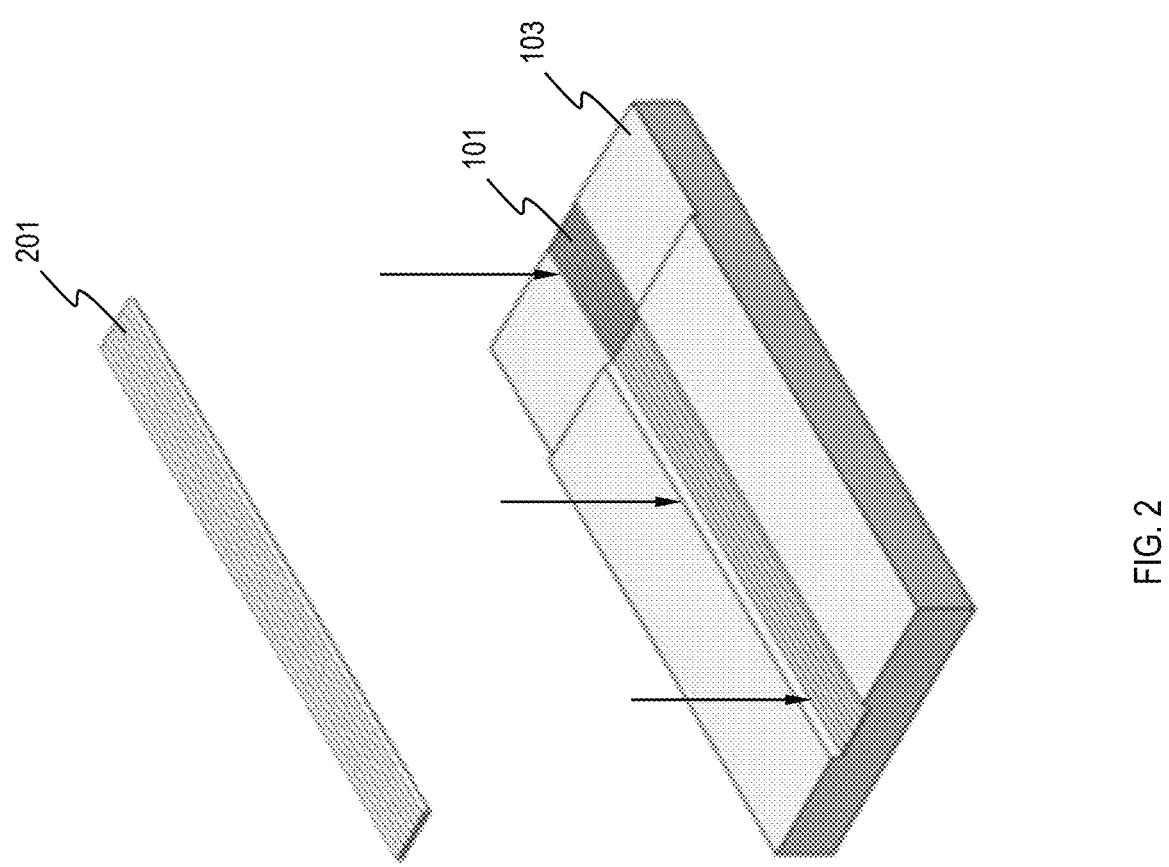
Figure 3:
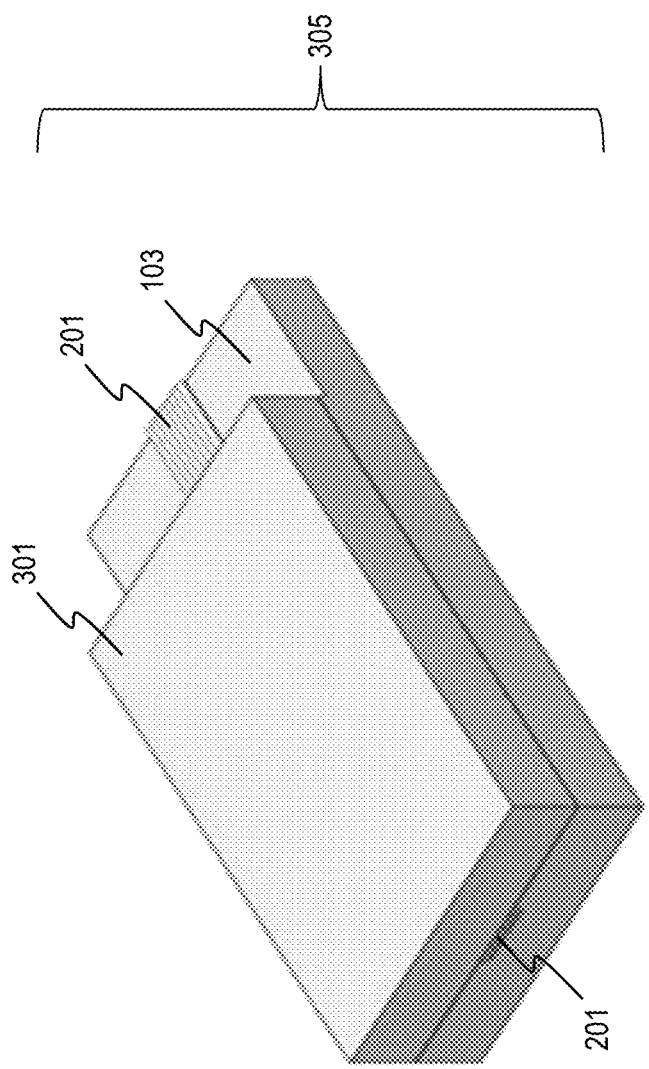
Figure 4:
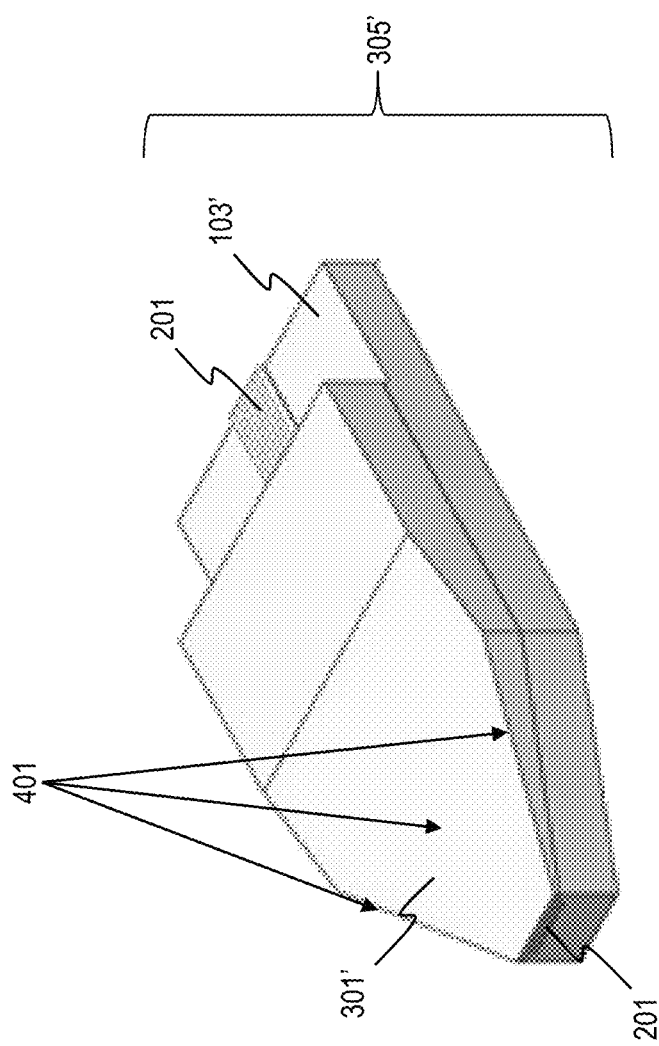

FIGS. 1 through 4, 6 and 7 schematically illustrate cross-sectional views of a process flow for forming a wedge-shaped fiber array and a bottom base according to a probing pad layout of a Si-Photonic device to enable optical, DC and RF mixed signal tests to be performed at the same time and FIGS. 5A and 5B illustrate a top-view and a cross-sectional view of FIG. 4, respectively, in accordance with an exemplary embodiment. Referring to FIG. 1, a plurality of V-shaped grooves 101 are formed in a fiber array pedestal 103 using a conventional etching process for providing the necessary retention for optical fibers therein. In one instance, the fiber array pedestal 103 is a substrate including Si, glass, or any other material with similar functional properties. Then, an optical fiber 201 is placed in each of the V-shaped grooves 101 using a conventional process, as illustrated in FIG. 2. In one instance, the optical fiber 201 includes glass, polymers or any other material with similar functional properties. Thereafter, a cover 301 is formed over a portion of the plurality of optical fiber 201 and the fiber array pedestal 103 to support the alignment of the plurality of optical fiber 201 in the V-shaped grooves 101, forming fiber array 305, as illustrated in FIG. 3. In one instance, the cover 301 includes Si, glass or any other material with similar functional properties.

Referring to FIGS. 4, 5A and 5B portions of the cover 301 and the fiber array pedestal 103 undergo a conventional polishing process. The sidewall portions of the cover 301 and the fiber array pedestal 103 are polished to angle 501, e.g., of 45 to 60 degrees, and a top surface of the cover 301 is polished to angle 503, e.g., of 45 to 60 degrees, based on a distance between the grating coupler and the probing pads of a Si-photonic device (not shown for illustrative convenience), forming cover 301', fiber array pedestal 103' and polished fiber array 305'. In one instance, the sidewall portions of the cover 301 and the fiber array pedestal 103, and the top surface of the cover 301 may be polished at an angle, e.g., of 0 to 90 degrees. In one instance, the probing pads of the Si-photonic device include a DC probing pad and a RF probing pad. In this instance, the polished portion of the cover 301' and the fiber array pedestal 103' is wedge-shaped (represented by the arrows 401). In another instance, the polished portion of the cover 301 and the fiber array pedestal 103 may form any other shapes based on the distance between the grating coupler and the probing pads of the Si-photonic device. In one instance, the edge 505 of cover 301' has a minimum thickness of 300 µm or the thickness is based on the distance between the grating coupler and the probing pads.

Figure 6:
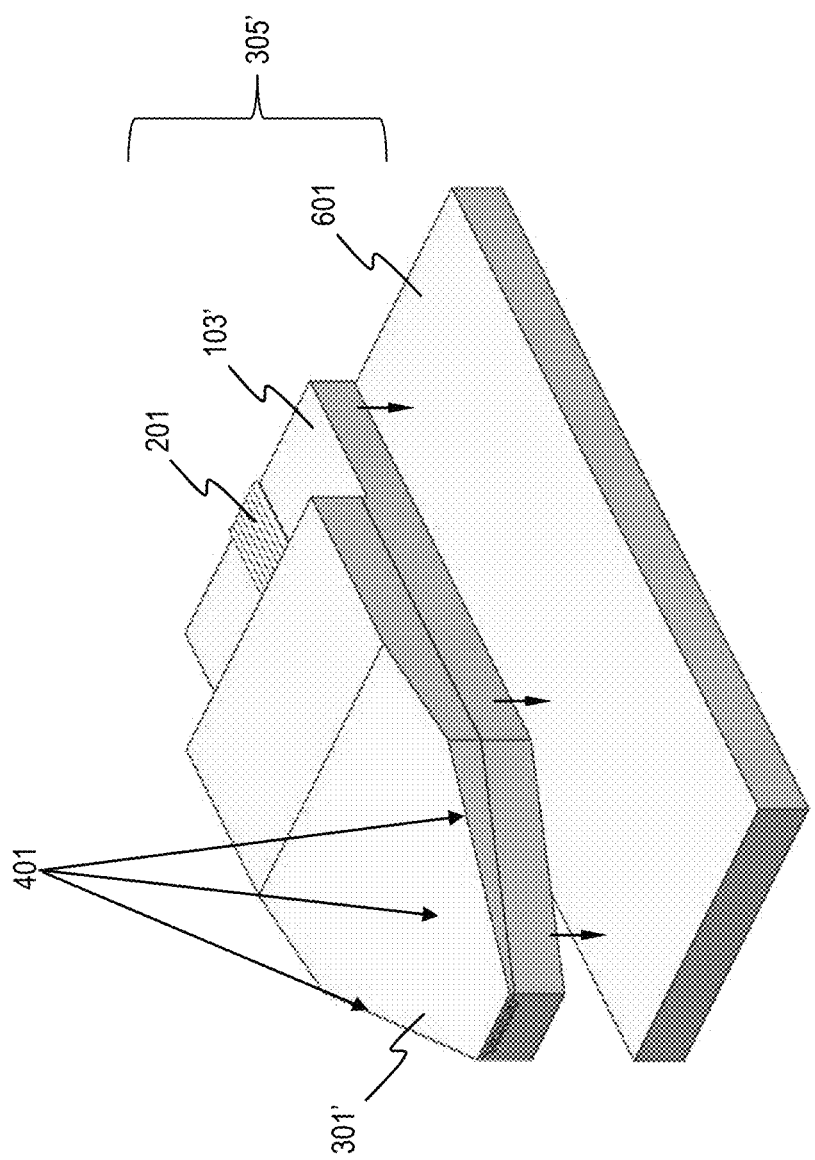
Figure 7:
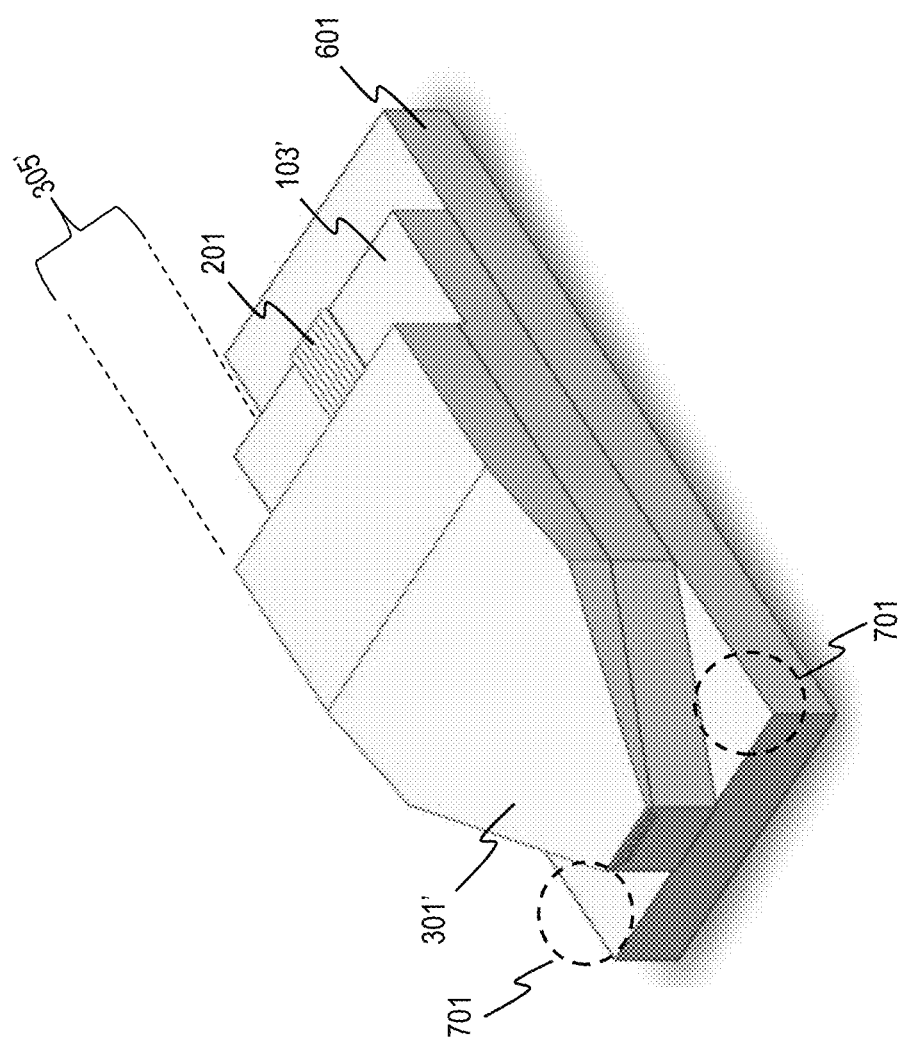

Referring to FIG. 6, the polished fiber array 305' is attached to a bottom base 601. In one instance, the bottom base 601 may be formed, e.g., of Si, glass or any other material with similar functional properties, to a thickness according to a layout of the grating coupler and the probing pads of the Si-photonic device. The wedge-shaped polished fiber array 305' attached to the bottom base 601 exposes areas 701 of the bottom base 601, thereby allowing space for probe tips of the probing pads of the Si-photonic device, as illustrated in FIG. 7. Thereafter, the front surface of the bottom base 601 is polished (not shown for illustrative convenience) by a conventional process for the termination of the fiber array 305', e.g., to remove any sharp edges from the optical fiber 201.

Figure 8:
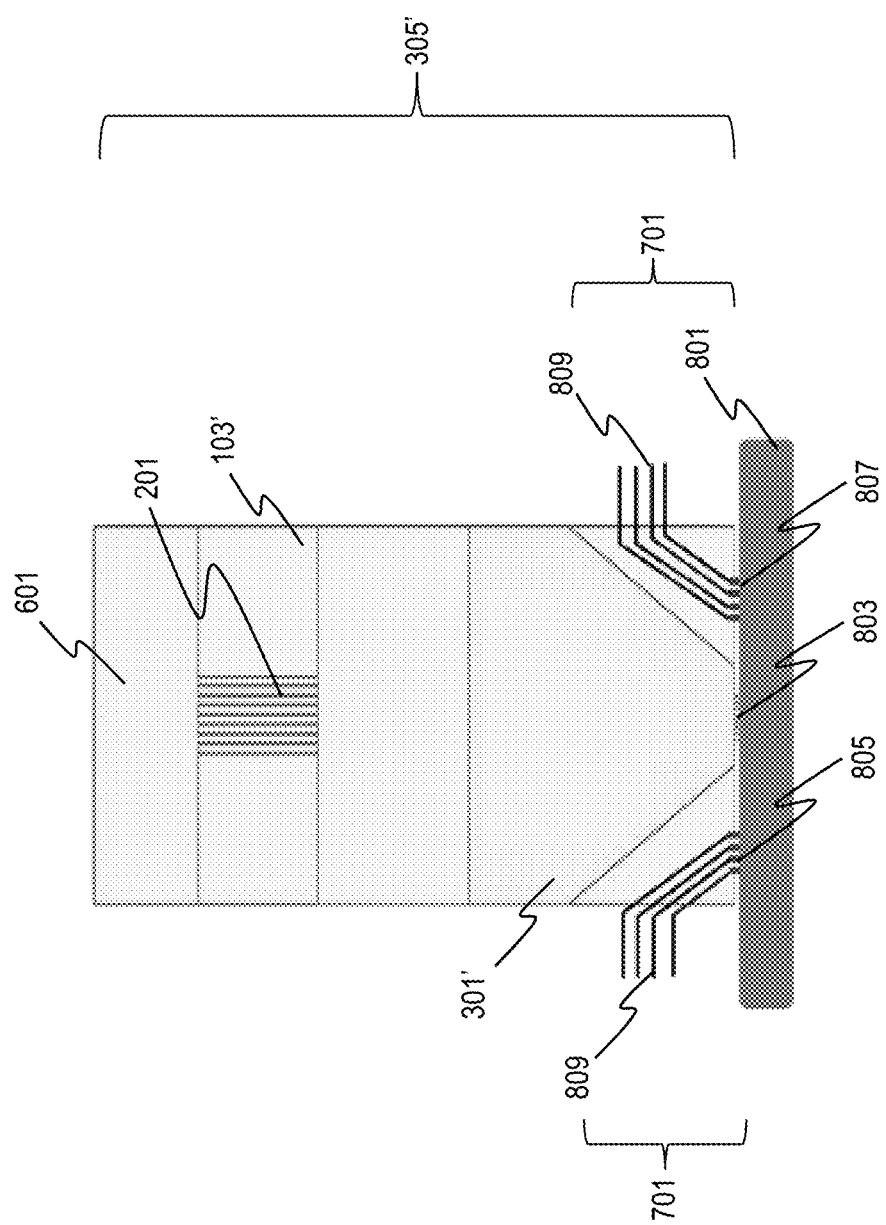
FIG. 8 schematically illustrates a top-view of the resultant wedge-shaped fiber array and bottom base attached to a Si-Photonic device, in accordance with an exemplary embodiment.

FIG. 8 schematically illustrates a top-view of the resultant wedge-shaped fiber array and bottom base attached to a Si-Photonic device, in accordance with an exemplary embodiment. Referring to FIG. 8, the polished fiber array 305' and bottom base 601 are attached to a Si-photonic device 801 to perform wafer-level optical, DC and RF mixed signal testing. In one instance, the Si-photonic device 801 includes a grating coupler 803, a DC probing pad 805 and a RF probing pad 807. In one instance, the distance between the grating coupler 803 and the DC probing pad 805 is at least 350 µm. The grating coupler 803, the DC probing pad 805 and the RF probing pad 807 may be attached to the polished fiber array 305' and bottom base 601 using conventional alignment techniques, followed by epoxy methods. As depicted, the DC and RF probe tips 809 are exposed for electrical DC and RF measurement during the wafer-level Si-photonic testing.

The embodiments of the present disclosure can achieve several technical effects, such as optics, DC and RF mixed signal tests on a Si-Photonic device at the same time, higher throughputs, low crack damage risk on the contact pad relative to known fiber arrays, stronger mechanical strength to enclose the fiber array in the V-shaped grooves and lower contact pressure between the fiber array and a wafer. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in various types of semiconductor devices including fiber arrays for Si-photonic device testing.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a bottom base; and
   a fiber array with sidewalls and a top surface having a first angle and a second angle, respectively, over the bottom base,
   wherein the fiber array is structured to expose bond pads of a to be connected silicon (Si)-Photonic device for wafer level Si-Photonic testing,
   wherein the sidewalls and the top surface of the fiber array form a wedge shape that exposes areas of the bottom base adjacent to the wedge shape.

2. The device according to claim 1, wherein the fiber array comprises:
   a pedestal with a plurality of V-shaped grooves;
   an optical fiber in each V-shaped groove; and
   a cover over the pedestal.

3. The device according to claim 1, wherein the first angle and the second angle are based on a distance between a grating coupler and probing pads of the Si-Photonic device.

4. The device according to claim 3, wherein the first angle and the second angle are polished at an angle between 45 to 60 degrees.

5. The device according to claim 1, wherein thickness of the bottom base is based on layout information of a grating coupler and probing pads of the Si-Photonic device.

6. The device according to claim 3, wherein the distance between the grating coupler and the probing pads is at least 350 micrometer (μm).

7. The device according to claim 3, wherein the probing pads comprise a direct current (DC) probing pad and a radio frequency (RF) probing pad.

8. A method comprising:
   providing a fiber array;
   polishing sidewalls and a top surface of the fiber array to a first angle and a second angle, respectively, wherein the sidewalls and the top surface of the fiber array form a wedge shape, and wherein the fiber array is structured to expose bond pads of a silicon (Si)-Photonic device;
   forming a bottom base;
   attaching the polished fiber array to the bottom base, wherein exposed areas of the bottom base are adjacent to the wedge shape;
   polishing the bottom base subsequent to the attaching for a termination of the fiber array; and
   attaching the polished fiber array and the polished front surface of the bottom base to a Si-photonic device to perform optical, direct current (DC), and radio frequency (RF) mixed signal tests, wherein the Si-photonic device comprises a grating coupler and probing pads.

9. The method according to claim 8, wherein the first angle and the second angle are based on a distance between the grating coupler and the probing pads.

10. The method according to claim 8, wherein the bottom base is formed to a thickness according to a layout of the grating coupler and the probing pads.

11. The method according to claim 9, wherein the distance between the grating coupler and the probing pads is at least 350 micrometer (μm).

12. The method according to claim 8, wherein the probing pads comprise a DC probing pad and a RF probing pad.

13. The method according to claim 8, wherein the polished sidewalls and top surface of the fiber array form a wedge shape exposing the bond pads for the DC and RF mixed signal tests.

14. The method according to claim 8, wherein the fiber array comprises a pedestal with a plurality of V-shaped grooves, an optical fiber in each V-shaped groove, and a cover over the pedestal.

15. A method comprising:
    providing a fiber array of silicon (Si) or glass comprising a pedestal having a plurality of V-shaped grooves, an optical fiber in each V-shaped groove, and a cover over the pedestal;
    polishing sidewalls and a top surface of the fiber array to a first angle and a second angle, respectively, wherein the first angle and the second angle are based on a distance between a grating coupler and probing pads of a Si-Photonic device;
    forming a bottom base of Si or glass according to a probing pad layout of the Si-Photonic device and to a thickness according to a layout of the grating coupler and the probing pads;
    attaching the polished fiber array to the bottom base;
    polishing the bottom base subsequent to the attaching for a termination of the fiber array; and
    attaching the polished fiber array and bottom base to the Si-photonic device,
    wherein the sidewalls and the top surface of the fiber array form a wedge shape that exposes areas of the bottom base adjacent to the wedge shape.

16. The method according to claim 15, wherein the distance between the grating coupler and the probing pads is at least 350 micrometer (μm).

* * * * *